(12) United States Patent
Sato (10) Patent No.: US 6,423,988 B1
(45) Date of Patent: Jul. 23, 2002

(54) PRESSURE-CONTACT SEMICONDUCTOR DEVICE

(75) Inventor: Katsumi Sato, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/530,598

(22) PCT Filed: Sep. 10, 1998

(86) PCT No.: PCT/JP98/04104

§ 371 (c)(1),
(2), (4) Date: May 9, 2000

(87) PCT Pub. No.: WO00/16394

PCT Pub. Date: Mar. 23, 2000

(51) Int. Cl.[7] .......................... H01L 29/74; H01L 31/111
(52) U.S. Cl. .......................... 257/181; 257/151; 257/153; 327/440
(58) Field of Search .................. 257/151, 153, 257/147, 181, 182; 327/440, 438, 582

(56) References Cited

U.S. PATENT DOCUMENTS 5,345,096 A     9/1994  Gruening ................. 257/182
5,739,556 A     4/1998  Bolgiani ................. 257/182
5,777,351 A  *  7/1998  Taguchi et al.
5,777,506 A  *  7/1998  Kurachi et al.

OTHER PUBLICATIONS

Mitsubishi Denki Giho, vol. 71, No. 12, pp. 61 to 66, "Bulk GCT Thyristor Having High Withstand Voltage and its Application", 1997.

* cited by examiner

*Primary Examiner*—Douglas Wille
*Assistant Examiner*—Dilinh Nguyen
(74) *Attorney, Agent, or Firm*—Oblon, Spivak, McClelland, Maier & Neustadt, P.C.

(57) ABSTRACT

This invention relates to a pressure-contact type semiconductor device (1) having a ring-shaped gate terminal, and aims at overcoming such a technical problem that a gate current is not uniformly supplied to a semiconductor substrate (4) due to a connection structure for the device (1) and an external gate driver (2). For this purpose, a ring-shaped gate terminal (10) is structured as a resistor whose resistivity is at least 0.1 m$\Omega$·cm in the present invention. Thus, a voltage drop by the aforementioned resistor enlarges in a concentrated part of the gate current, and it follows that the gate current is shunted to another non-concentrated part. The present invention is utilizable as a high-power element in a power applied device.

17 Claims, 4 Drawing Sheets

PRESSURE-CONTACT SEMICONDUCTOR DEVICE

TECHNICAL FIELD

The present invention relates to the structure of a pressure-contact type semiconductor device used for a power converter.

BACKGROUND ART

In the field of bulk power electronic devices, a snubberless GCT (Gate-Commutated Turn-off) thyristor having a maximum breaking current of 4000 A and a turn-off storage time of not more 3 μs is being implemented as that substituting for a conventional GTO (Gate Turn-off) thyristor, in order to satisfy requirement for a higher withstand voltage and a higher current.

The operation principle of the GCT thyristor and its structure are disclosed in European Patent Laying-Open Gazette EP0785627A2 (Japanese Patent Laying-Open Gazette No. 9-201039), Japanese Patent Laying-Open Gazette No. 8-330572 and Mitsubishi Denki Giho Vol. 71, No. 12, pp. 61–66, for example. The characteristics thereof are summarized as follows: That is, in the GCT thyristor, the shape of a gate terminal coming into contact with a ring gate electrode and drawn out from an insulator tube is changed from a lead shape of the conventional GTO thyristor to a ring shape while connection between the GCT thyristor and a gate drive circuit is also improved from a lead wire structure of the GTO thyristor to a structure by a multilayer substrate. Thus, the inductance of the gate terminal and a gate wire is reduced to about 1/100 of the inductance of the GTO thyristor and it is possible to isotropically supply a gate current of an opposite direction fed at a turn-off time from the overall circumferential surface of the gate electrode while reduction of the turn-off storage time is also enabled. As to the wafer structure of the GCT thyristor, thousands of segments are concentrically arranged in a parallel manner in a several-stage structure and a gate electrode region forming an interface with the gate electrode is arranged on the outermost peripheral portion thereof, similarly to the wafer structure of the conventional GTO thyristor.

Figure 3:
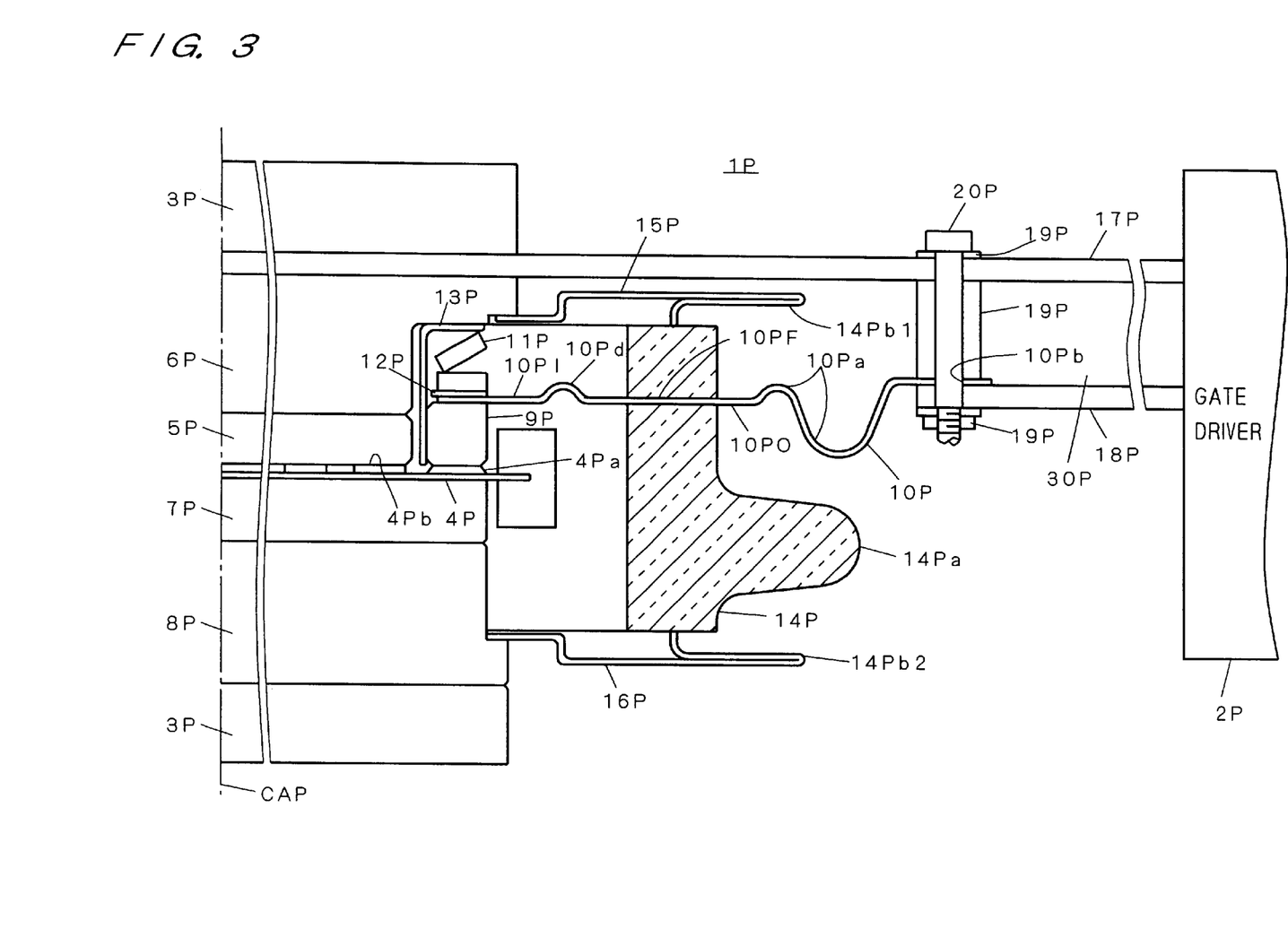
FIG. 3 is a longitudinal sectional view showing an example of the structure of a conventional pressure-contact type semiconductor device.

FIG. 3 is a longitudinal sectional view showing the structure of a conventional GCT device 1P inclusive of an external gate driver 2P for controlling the GCT device 1P. Since the GCT device 1P has a laterally symmetrical structure in relation to a central axis CAP, only the structure of one side thereof is shown in FIG. 3.

Each reference numeral in FIG. 3 denotes the following each element: That is, stack electrodes 3P are electrodes for pressurizing the GCT device 1P and taking out a current. 4P is a semiconductor substrate (wafer), and a gate electrode 4Pa of aluminum coming into contact with a gate electrode region is formed in the form of a ring on the outermost peripheral portion of its first main surface, while a plurality of cathode electrodes 4Pb are concentrically formed on the first main surface of the semiconductor substrate 4P inside the gate electrode 4Pa. 5P and 6P are a cathode distortion buffer plate and a cathode post electrode successively loaded on the cathode electrodes 4Pb of the semiconductor substrate 4P respectively, a non-illustrated anode electrode is fully formed on a second main surface (surface opposite to the first main surface) corresponding to the rear surface of the semiconductor substrate 4P, and an anode distortion buffer plate 7P and an anode post electrode 8P are successively loaded on this anode electrode. 9P is a ring gate electrode whose first surface (lower surface) comes into surface contact with the gate electrode 4Pa of the semiconductor substrate 4P, 10P is a ring-shaped gate terminal of a metal plate (which is an iron-42% nickel alloy, for example), and an inner peripheral side end portion of its inner peripheral plane part 10PI is slidably arranged on a second surface (upper surface opposed to the aforementioned first surface) of the ring gate electrode 9P. Further, an elastic body 11P such as a belleville spring or a waved spring presses the ring gate electrode 9P against the gate electrode 4Pa through an annular insulator 12P along with the aforementioned end portion of the inner peripheral plane part 10PI of the ring-shaped gate terminal 10P. Due to this pressing, the gate electrode 4Pa, the ring gate electrode 9P and the ring-shaped gate terminal 10P are electrically connected with each other. 13P is an insulating sheet for insulating the ring gate electrode 9P from the opposed cathode distortion buffer plate 5P and the cathode post electrode 6P. The ring-shaped gate terminal 10P is further formed by an intermediate part or fixed part 10PF and an outer peripheral plane part 10PO in addition to the aforementioned inner peripheral plane part 10PI, and a bent part 10Pd is provided on a portion not in surface contact with the ring gate electrode 9P in the inner peripheral plane part 10PI while a bent part 10Pa is formed also on an intermediate portion of the outer peripheral plane part 10PO.

On the other hand, 14P is an insulator tube consisting of ceramics, which is vertically divided through the intermediate part 10PA of the ring-shaped gate terminal 10P and has a projection part 14Pa. The fixed part 10PA of the ring-shaped gate terminal 10P and the insulator tube 14P are airtightly fixed to each other by braze bonding. In a portion of the outer peripheral plane part 10PO of the ring-shaped gate terminal 10P drawn outward from the outer peripheral side surface of the insulator tube 14P slightly closer to the side of the inner peripheral portion than the outer peripheral end thereof, a plurality of mounting holes 10Pb for coupling this ring-shaped gate terminal 10P to the gate driver 2P are provided at prescribed intervals toward the circumferential direction. Further, an end part 14Pb1 of a first L-shaped portion bent to project outward from the upper surface of the insulator tube 14P and one end portion of a ring-shaped first flange 15P are airtightly fixed by arc welding, and an end part 14Pb2 of a second L-shaped portion projecting from the lower surface of the insulator tube 14P and one end portion of a second flange 16P are also airtightly fixed similarly by arc welding. Other end portions of the first and second flanges 15P and 16P are fixed to parts of notched portions of the cathode post electrode 6P and the anode post electrode 8P respectively. Thus, the GCT device 1P is in a structure closed against the exterior. This interior is replaced with inert gas.

Further, 17P is a plate-shaped control electrode formed by an annular metal plate arranged to be concentric with the ring-shaped gate terminal 10P, and brought into pressure contact with the cathode post electrode 6P by the stack electrode 3P. A plate-shaped control gate electrode 18P formed by an annular metal plate is arranged to be concentric with the ring-shaped gate terminal 10P similarly to the plate-shaped control electrode 17P, and electrically connected in its inner peripheral side end portion with the outer peripheral side end portion of the outer peripheral plane part 10PO of the ring-shaped gate terminal 10P. Both electrodes 17P and 18P are rendered to form a multilayer substrate through an insulating substrate 30P. Connection of both electrodes 17P and 18P to the GCT device 1P is implemented by the following members 19P and 20P: That is, 19P is an insulating sleeve for insulating the ring-shaped gate terminal 10P and the plate-shaped control gate electrode 18P from the plate-shaped control electrode 17P, 20P is a connection part formed by a bolt, a nut and the like for electrically connecting the ring-shaped gate terminal 10P and the plate-shaped control gate electrode 18P with each other between the plate-shaped control electrode 17P and the plate-shaped control gate electrode 18P through the insulating sleeve 19P, and the nut in the connection part 20P passes through a mounting hole provided in the plate-shaped control gate electrode 18P in correspondence to the mounting hole 10Pb and the mounting hole 10Pb. The plate-shaped control electrode 17P and the plate-shaped control gate electrode 18P are directly coupled to the gate driver 2P respectively.

While a larger capacity and a higher speed of a semiconductor device for power electronics have been rendered implementable due to the development of the aforementioned GCT thyristor, a much larger capacity and a much higher speed of the GCT thyristor are required. In implementation of this requirement, however, new problems shown below are arising.

That is, it is necessary to increase the number of GCT segments connected in parallel with each other, in order to attain further improvement of a breaking current. In order to satisfy this requirement, (i) it is necessary to progress increase of the diameter of the semiconductor substrate 4P, and (ii) it is necessary to maintain a uniform operation of each segment in the semiconductor substrate 4P even if such further increase of the diameter is progressed. Therefore, it is required that a structure for uniformly supplying a gate current to a total gate electrode region formed on the outermost peripheral portion of the semiconductor substrate 4P at a turn-on time while uniformly extracting a reverse gate current from the total gate electrode region at a turn-off time is implemented in response to progress of increase of the diameter of the semiconductor substrate 4P. Particularly a GCT element ensures its breaking ability by instantaneously changing the gate current to a value substantially equal to the breaking current with a gradient of several 1000 A/$\mu$s, and hence the point is how uniformly to supply a signal to the gate electrode region for uniformly operating the semiconductor substrate.

In the GCT device 1P according to the conventional structure illustrated in FIG. 3, however, a mounting structure of a GCT element (corresponding to a portion excluding the multilayer substrate 17P and 18P from the GCT device 1P here) and the external gate driver 2P through the multilayer substrate 17P and 18P and dispersion of the mounting state thereof frequently result in such a situation that a uniform gate current is not supplied to the ring-shaped gate terminal 10P of the GCT element.

Figure 4:
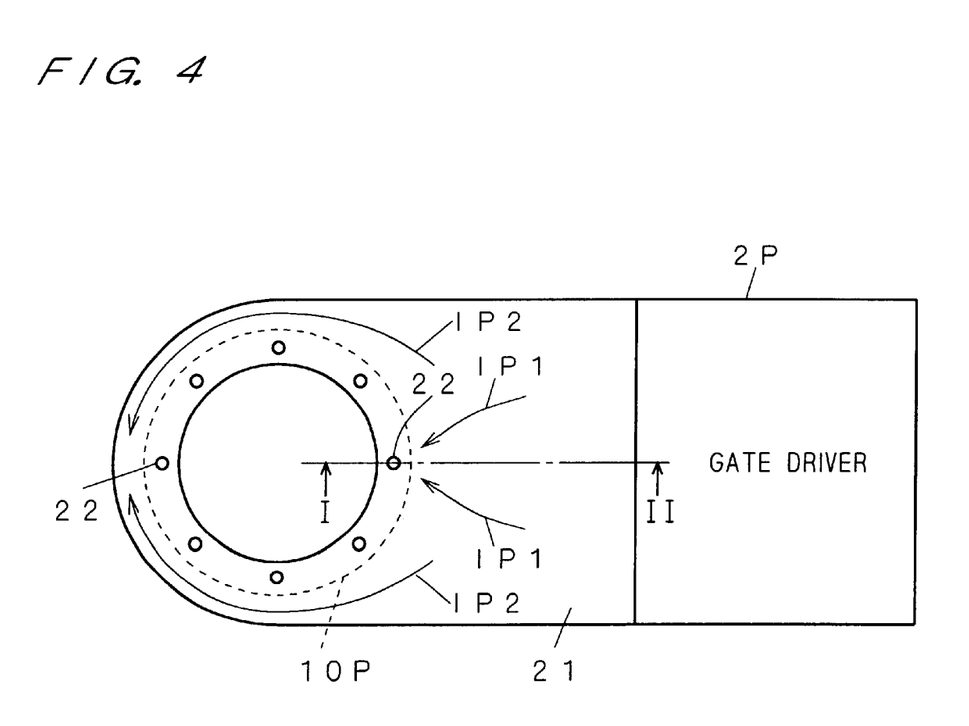
FIG. 4 is a plan view for schematically pointing out problems in the conventional pressure-contact type semiconductor device.

FIG. 4 is a plan view of the GCT device 1P typically showing this problem, and this FIG. 4 shows the multilayer substrate 17P, 18P and 30P in FIG. 3 as a multilayer substrate 21 in an integrated manner. That is, details of a longitudinal sectional view related to a break line I-II in FIG. 4 correspond to FIG. 3, and FIG. 4 merely typically shows the mounting state of the multilayer substrate 21 and the ring-shaped gate terminal 10P. As shown in this FIG. 4, current paths IP1 to a portion of mounting parts 22 of the multilayer substrate 21 and the ring-shaped gate terminal 10P located on the side of the gate driver 2P are smaller in wiring resistance thereof than current paths IP2 to the side of a mounting part 22 located on an opposite side to the gate driver 2P. Therefore, it follows that most of the gate current concentrates to the mounting parts 22 on the side of the gate driver 2P. Such a wiring structure renders supply of the gate current to the ring-shaped gate terminal 10P and extraction of the reverse gate current from the ring-shaped gate terminal 10P through the multilayer substrate 21 non-uniform. If a uniform gate current is not supplied to the ring-shaped gate terminal 10P, it follows that a uniform operation of each segment in the semiconductor substrate 4P is deteriorated and the aforementioned requirement cannot be satisfied. Such a problem arises not only at the turn-on time, but also at the turn-off time.

DISCLOSURE OF INVENTION

The present invention has been proposed in order to solved the aforementioned problems, and aims at providing a pressure-contact type semiconductor device which can attain uniform operations of elements despite increase of the diameter of a semiconductor substrate by rendering a uniform gate current suppliable to a gate terminal part formed by a multilayer substrate, a ring-shaped gate terminal, a ring gate electrode and a gate electrode.

The invention according to a first aspect is characterized in that a pressure-contact type semiconductor device comprises a discoidal semiconductor substrate having a gate electrode region arranged on its outermost peripheral portion and gate terminal means having one side coming into contact with the gate electrode region and another side elongated to an outer part for forming a path for a gate current while uniformly supplying the gate current to the gate electrode region.

The invention according to a second aspect is the pressure-contact type semiconductor device described in the aforementioned first aspect, and characterized in that the gate terminal means functions as a resistance whose resistivity is at least 0.1 m$\Omega$·cm.

The invention according to a third aspect is the pressure-contact type semiconductor device described in the aforementioned second aspect, and characterized in that the gate terminal means comprises an annular gate electrode formed on a surface of the gate electrode region, a ring gate electrode of an annular body coming into contact with the gate electrode, a ring-shaped gate terminal of an annular plate having an inner peripheral side end portion coming into contact with the ring gate electrode, and a multilayer substrate having one side coming into contact with an outer peripheral side end portion of the ring-shaped gate terminal and another side elongated up to the outer part.

The invention according to a fourth aspect is the pressure-contact type semiconductor device described in the aforementioned third aspect, and characterized in that at least one of the ring-shaped gate terminal, the ring gate electrode and the gate electrode is a resistor having resistivity of at least 0.1 m$\Omega$·cm.

The invention according to a fifth aspect is the pressure-contact type semiconductor device described in the aforementioned third aspect, and characterized in that the gate terminal part further comprises a ring-shaped resistor arranged between the ring-shaped gate terminal and the ring gate electrode.

The invention according to a sixth aspect is the pressure-contact type semiconductor device described in the aforementioned third aspect, and characterized in that the gate terminal part further comprises a ring-shaped resistor arranged between the gate electrode and the ring gate electrode.

The invention according to a seventh aspect is the pressure-contact type semiconductor device described in the aforementioned third aspect, and characterized in that the gate terminal part further comprises a resistor arranged between the outer peripheral side end portion of the ring-shaped gate terminal and a part of the multilayer substrate coming into contact with the outer peripheral side end portion.

The invention according to an eighth aspect is the pressure-contact type semiconductor device described in the aforementioned third aspect, and characterized in that at least one of the ring-shaped gate terminal, the ring gate electrode and the gate electrode is coated with a resistor film.

The invention according to a ninth aspect is characterized in that a pressure-contact type semiconductor device comprises a discoidal semiconductor substrate having a gate electrode region arranged on its outermost peripheral portion, and a gate terminal part having one side coming into contact with the gate electrode region and another side elongated to an outer part for forming a path for a gate current and arranged for uniformly supplying the gate current to the gate electrode region.

The invention according to a tenth aspect is the pressure-contact type semiconductor device described in the aforementioned ninth aspect, and characterized in that the gate terminal part comprises a resistor whose resistivity is at least 0.1 mΩ·cm.

The invention according to an eleventh aspect is the pressure-contact type semiconductor device described in the aforementioned tenth aspect, and characterized in that the gate terminal part comprises an annular gate electrode formed on a surface of the gate electrode region, a ring gate electrode of an annular body coming into contact with the gate electrode, a ring-shaped gate terminal of an annular plate having an inner peripheral side end portion coming into contact with the ring gate electrode, and a multilayer substrate having one side coming into contact with an outer peripheral side end portion of the ring-shaped gate terminal and another side elongated up to the outer part, and at least one of the ring-shaped gate terminal, the ring gate electrode and the gate electrode is the resistor.

The invention according to a twelfth aspect is the pressure-contact type semiconductor device described in the aforementioned ninth aspect, and characterized in that the gate terminal part comprises an annular gate electrode formed on a surface of the gate electrode region, a ring-shaped resistor coming into contact with the gate electrode, a ring gate electrode of an annular body coming into contact with the resistor, a ring-shaped gate terminal of an annular plate having an inner peripheral side end portion coming into contact with the ring gate electrode, and a multilayer substrate having one side coming into contact with an outer peripheral side end portion of the ring-shaped gate terminal and another side elongated up to the outer part.

The invention according to a thirteenth aspect is the pressure-contact type semiconductor device described in the aforementioned ninth aspect, and characterized in that the gate terminal part comprises an annular gate electrode formed on a surface of the gate electrode region, a ring gate electrode of an annular body coming into contact with the gate electrode, a ring-shaped resistor coming into contact with the ring gate electrode, a ring-shaped gate terminal of an annular plate having an inner peripheral side end portion coming into contact with the resistor, and a multilayer substrate having one side coming into contact with an outer peripheral side end portion of the ring-shaped gate terminal and another side elongated up to the outer part.

The invention according to a fourteenth aspect is the pressure-contact type semiconductor device described in the aforementioned ninth aspect, and characterized in that the gate terminal part comprises an annular gate electrode formed on a surface of the gate electrode region, a ring gate electrode of an annular body coming into contact with the gate electrode, a ring-shaped gate terminal of an annular plate having an inner peripheral side end portion coming into contact with the ring gate electrode, a resistor coming into contact with an outer peripheral side end portion of the ring-shaped gate terminal, and a multilayer substrate having one side coming into contact with the resistor and another side elongated up to the outer part.

The invention according to a fifteenth aspect is the pressure-contact type semiconductor device described in the aforementioned ninth aspect, and characterized in that the gate terminal part comprises an annular gate electrode formed on a surface of the gate electrode region, a ring gate electrode of an annular body coming into contact with the gate electrode, a ring-shaped gate terminal of an annular plate having an inner peripheral side end portion coming into contact with the ring gate electrode, and a multilayer substrate having one side coming into contact with the outer peripheral side end portion of the ring-shaped and another side elongated up to the outer part, and at least one of the ring-shaped gate terminal, the ring gate electrode and the gate electrode is coated with a resistor film.

The invention according to a sixteenth aspect is characterized in that a pressure-contact type semiconductor device comprises a discoidal semiconductor substrate having an annular gate electrode formed on its surface, a ring gate electrode of an annular body coming into contact with the gate electrode, and a ring-shaped gate terminal of an annular plate having an inner peripheral side end portion coming into contact with the ring gate electrode, and the ring-shaped gate terminal is a resistor having resistivity of at least 0.1 Ω·cm.

According to the semiconductor device in each of the first to sixteenth aspects of the present invention, the resistor functional as a resistance is arranged on the path reaching the gate electrode from the multilayer substrate through the ring-shaped gate terminal and the ring gate electrode, whereby a voltage drop in the resistor located on a part where the gate current concentrates enlarges and the gate current hardly flows on the part if a uniform gate current is not supplied, and the gate current is consequently shunted to another part where the quantity of the gate current is small. Therefore, the present invention enables supply of a substantially uniform gate current to the semiconductor substrate and can implement prevention of occurrence of a non-uniform operation. Similarly, the present invention can also uniformalize extraction of a reverse gate current.

Objects, features, aspects and advantages of the present invention are now described in detail inclusive of the aforementioned ones as well as other ones with the accompanying drawings.

BEST MODES FOR CARRYING OUT THE INVENTION (Embodiment 1)

Figure 1:
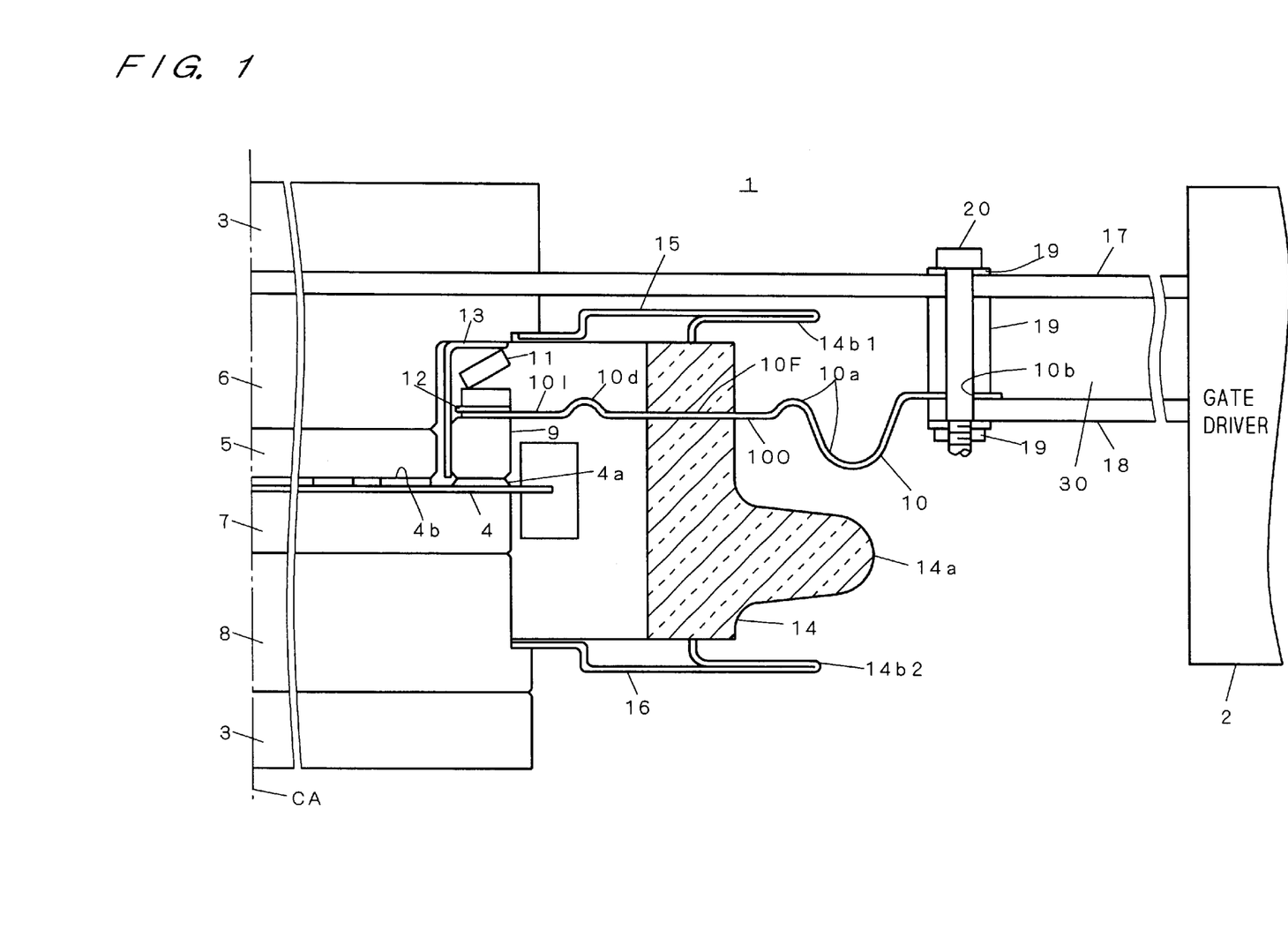
FIG. 1 is a longitudinal sectional view showing an example of the structure of a pressure-contact type semiconductor device according to the present invention.

FIG. 1 is a longitudinal sectional view showing the structure of a GCT device 1 which is an example of a pressure-contact type semiconductor device according to this embodiment inclusive of an external gate driver 2. However, since the GCT device 1 has a laterally symmetrical structure in relation to a central axis CA, only the structure of one side thereof is shown in FIG. 1. The structure shown in FIG. 1 corresponds to a longitudinal sectional view related to a break line I-II shown in FIG. 4.

Each reference numeral in FIG. 1 denotes the following each element: That is, 2 is the gate driver for controlling the GCT device 1, and 3 is a stack electrode pressurizing the GCT device 1 as well as taking out a current. 4 is a semiconductor substrate (wafer) having a pnpn structure on which thousands of segments are concentrically arranged in parallel, and a gate electrode 4a of aluminum electrically coming into contact with a gate electrode region on the outermost peripheral portion of this substrate is formed on the outermost peripheral portion of its first main surface or surface in the form of a ring, while a plurality of cathode electrodes 4b are concentrically formed on the first main surface of the semiconductor substrate 4 located inward beyond the gate electrode 4a.

5 and 6 are a cathode distortion buffer plate and a cathode post electrode successively loaded on the cathode electrodes 4b of the semiconductor substrate 4 respectively, a non-illustrated anode electrode is fully formed on a second main surface (surface opposite to the first main surface) corresponding to the rear surface of the semiconductor substrate 4, and an anode distortion buffer plate 7 and an anode post electrode 8 are successively loaded on this anode electrode.

9 is a ring gate electrode whose first surface (lower surface) comes into surface contact with the gate electrode 4a of the semiconductor substrate 4, while 10 is a ring-shaped shaped gate terminal formed by a metal plate, and an inner peripheral side end portion of its inner peripheral plane part 10I is slidably arranged on a second surface (upper surface opposite to the aforementioned first surface) of the ring gate electrode 9. Further, an elastic body 11 such as a belleville spring or a waved spring presses the ring gate electrode 9 against the gate electrode 4a through an annular insulator 12 along with the aforementioned end portion of the inner peripheral plane part 10I of the ring gate terminal 10. Due to this pressing, the gate electrode 4a, the ring gate electrode 9 and the ring-shaped gate terminal 10 are electrically connected with each other. Further, 13 is an insulating sheet for insulating the ring gate electrode 9 from the opposite cathode distortion buffer plate 5 and the cathode post electrode 6. The ring-shaped gate terminal 10 is further formed by an intermediate part or a fixed part 10F and an outer peripheral plane part 10O in addition to the aforementioned inner peripheral plane part 10I, and a bent part 10d is provided on a portion not in surface contact with the ring gate electrode 9 in the inner peripheral plane part 10I, while a bent part 10a is formed also on an intermediate portion of the outer peripheral plane part 10O.

Figure 2:
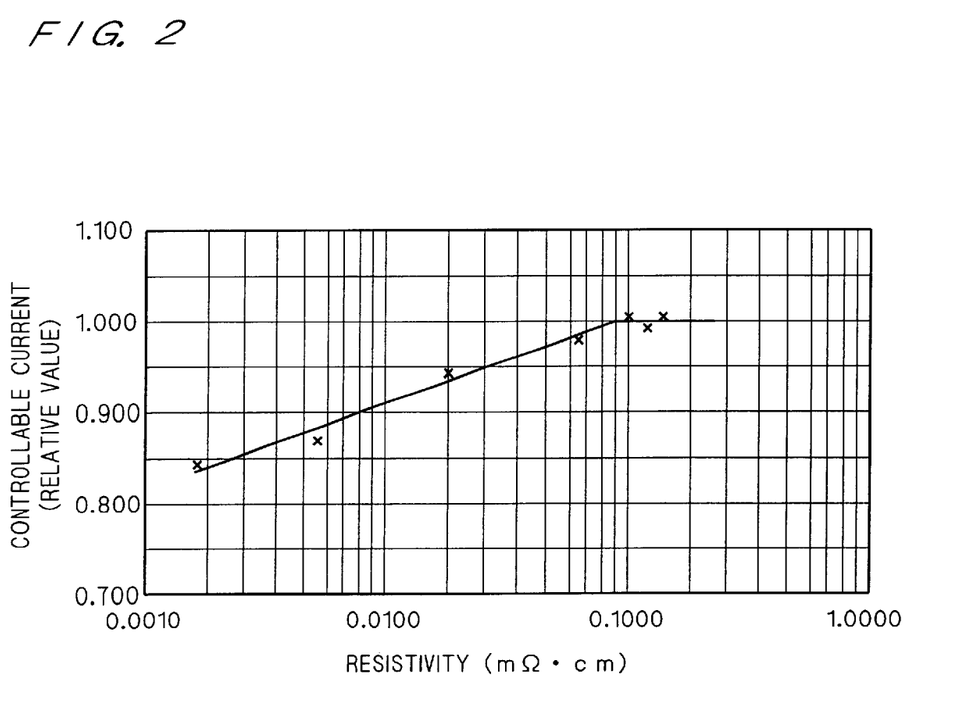
FIG. 2 is a diagram showing results of an experiment performed for selecting resistivity of a ring-shaped gate terminal according to the present invention.

On the other hand, 14 is an insulator tube consisting of ceramics (e.g., alumina), vertically divided through the intermediate part 10F of the ring-shaped gate terminal 10, further has a projection part 14a on its outer peripheral side surface portion, and includes the main parts 4, 5, 7, 9, 10, 11 and 12 in the tube. The fixed part 10F of the ring-shaped gate terminal 10 and the insulator tube 14 are airtightly fixed to each other by braze bonding. In a portion of the outer peripheral plane part 10O of the ring-shaped gate terminal 10 drawn outward from the outer peripheral side surface portion of the insulator tube 14 slightly closer to the side of the inner peripheral portion than the outer peripheral end thereof, a plurality of mounting holes 10b for coupling this ring-shaped gate terminal 10 to the gate driver 2 are provided at prescribed intervals toward the circumferential direction. FIG. 2 which is a top plan view of the ring-shaped gate terminal 10 shows this point. Further, an end part 14b1 of a first L-shaped portion bent to project outward from the upper surface of the insulator tube 14 and one end portion of a ring-shaped first flange 15 are airtightly fixed by arc welding, and an end part 14b2 of a second L-shaped portion projecting from the lower surface of the insulator tube 14 and one end portion of a second flange 16 are also airtightly fixed similarly by arc welding. Other end portions of the first and second flanges 15 and 16 are fixed to parts of notched portions of the cathode post electrode 6 and the anode post electrode 8 respectively. Thus, the GCT device 1 is in a structure closed against the exterior. This interior is replaced with inert gas.

Further, 17 is a plate-shaped control electrode formed by an annular metal plate arranged to be concentric with the ring-shaped gate terminal 10, and brought into pressure contact with the cathode post electrode 6 by the stack electrode 3. A plate-shaped control gate electrode 18 formed by an annular metal plate is arranged to be concentric with the ring-shaped gate terminal 10 similarly to the plate-shaped control electrode 17, and electrically connected with the outer peripheral side end portion of the outer peripheral plane part 10O of the ring-shaped gate terminal 10 on its inner peripheral side end portion. Both electrodes 17 and 18 sandwich the insulated substrate 30. Connection between both electrodes 17 and 18 and the GCT device 1 is implemented by the following members 19 and 20: That is, 19 is an insulating sleeve for insulating the ring-shaped gate terminal 10 and the plate-shaped control gate electrode 18 from the plate-shaped control electrode 17, 20 is a connection part formed by a bolt, a nut and the like for electrically connecting the ring-shaped gate terminal 10 and the plate-shaped control gate electrode 18 with each other between the plate-shaped control electrode 17 and the plate-shaped control gate electrode 18 through the insulating sleeve 19, and the nut in the connection part 20 passes through a mounting hole provided in the plate-shaped control gate electrode 18 in correspondence to the mounting hole 10b and the mounting hole 10b. The plate-shaped control electrode 17 and the plate-shaped control gate electrode 18 are directly coupled to the gate driver 2 respectively. Thus, both electrodes 17 and 18 and the insulated substrate 30 form a multilayer structure. In particular, the plate-shaped control electrode 18 is such a multilayer substrate that its one side comes into contact with the outer peripheral side end portion of the ring-shaped gate terminal 10 while its another side is elongated up to the external gate driver (external gate circuit) 2.

In the aforementioned structure, the gate electrode 4a, the ring gate electrode 9, the ring-shaped gate terminal 10 and the multilayer substrate 18 form a current path for supplying a gate current from the gate driver 2 to the gate electrode region of the semiconductor substrate 4 at a turn-on time while extracting a reverse gate current from the gate electrode region and feeding this current to the gate driver 2 at a turn-off time, and the aforementioned members 4a, 9, 10 and 18 forming this path are generically referred to as "gate terminal part" here.

A point where this GCT device 1 is different from the conventional GCT device resides in a point that the aforementioned gate terminal part is designed so that the gate current is uniformly suppliable to the gate electrode region of the semiconductor substrate 4 and the reverse gate current is uniformly extractable from the gate electrode region. That is, the gate terminal part is designed to function as a resistance whose resistivity is equal to 0.1 mΩ·cm or more. In other words, the gate terminal part comprises a resistor of at least 0.1 mΩ·cm in resistivity. Here, a ring-shaped gate terminal 113 of an annular body is formed by a metal material (alloy) having resistivity of at least 0.1 Ω·cm as an example implementing such a gate terminal part.

An operation principle in the semiconductor device of the present invention resides in the following point: That is, when positively inserting a resistor functional as a resistance in the path reaching the gate electrode 4a from the multilayer substrate 18 through the ring-shaped gate terminal 10, a voltage drop developed in the resistor located on a part (for example, the mounting part 22 on the side of the current path IP1 in FIG. 4) where the gate current concentrates becomes larger than a voltage drop in another part and the gate current hardly flows in this concentrating part, and it consequently follows to that the gate current is shunted to the other part where the quantity of the gate current is small. By utilizing this point, it is possible to enable supply of a substantially uniform gate current to the semiconductor substrate and prevent non-uniform operations of GCT elements even if there is dispersion caused by the mounting state of the external gate circuit or a structure-shaped problem of the external gate circuit. This point is similar also as to extraction of the reverse gate current.

From such a point of view, the inventor positively employs the ring-shaped gate terminal 10 as a resistor functional as a resistance. It has been verified to what extent the resistivity of the ring-shaped gate terminal 10 is to be controlled so that the terminal 10 can effectively function as a resistor for preventing concentration of the gate current through an experiment. FIG. 2 shows the results.

The point to which the experiment shown in FIG. 2 is directed resides in the following point: That is, breaking resistance (controllable current) is improved by uniformalizing operations of the elements. In this experiment, therefore, the material for the ring-shaped gate terminal 10 was changed to change its resistivity, thereby examining influence of the resistivity of the ring-shaped gate terminal 10 on the breaking resistance (controllable current). At this time, conditions of a measuring circuit system and the external gate circuit were fixed to measure influence of only the resistivity of the ring-shaped gate terminal 10 on the breaking resistance. FIG. 2 shows results obtained by performing relative evaluation on the assumption that the breaking resistance is 1 when the resistivity of the ring-shaped gate terminal 10 is 0.166 mΩ·cm.

As obvious from FIG. 2, it is understood that the ring-shaped gate terminal 10 sufficiently functions as a resistor and improvement of the controllable current is obtained by rendering the resistivity of the ring-shaped gate terminal 10 at least 0.1 mΩ·cm. That is, it is conceivable that, when employing a conductive material whose resistivity is equal to 0.1 mΩ·cm or more as the material for the terminal 10, the resistance value in the gate terminal part which is the supply path for the gate current is not decided by wiring resistance in the current path part (or the mounting part) reaching the ring-shaped gate terminal 10 from the multilayer substrate 18 through the mounting part 22 (FIG. 4) but determined by the resistance value of the ring-shaped gate terminal 10 and the gate current consequently uniformly flows into the ring-shaped gate terminal 10 from the multilayer substrate 18. It is considered that this is similar also at the time of extraction of the reverse gate current.

As the material whose resistivity becomes at least 0.1 mΩ·cm, an Ni—Cr—Fe alloy (e.g., 0.1030 mΩ·cm in resistivity), an Ni—Cr alloy (e.g., 0.1300 mΩ·cm in resistivity), an Fe—Cr—Al alloy (e.g., 0.1660 mΩ·cm in resistivity) or the like can be exemplified.

(Modifications)

(a) While the ring-shaped gate terminal 10 itself has been structured as a resistor in the pressure-contact type semiconductor device shown in the embodiment 1, an equivalent effect is attained also when positively structuring the gate electrode 4a or the ring gate electrode 9 as a resistor in place thereof. In this case, it is preferable to render the resistivity of the gate electrode 4a or the ring gate electrode 9 at least 0.1 mΩ·cm similarly to the case of the ring-shaped gate terminal 10. Further, the gate electrode 4a or/and the ring gate electrode 9 may also be fully structured as a resistor having the aforementioned resistivity with the ring-shaped gate terminal 10. That is, in the pressure-contact type semiconductor device of the present invention, at least one of the ring-shaped gate terminal, the ring gate electrode and the gate electrode is structured as the resistor having resistivity of at least 0.1 mΩ·cm.

(b) Further, a ring-shaped resistor may be inserted between the gate electrode 4 and the ring gate electrode 9, or a ring-shaped resistor may be inserted between the ring-shaped gate terminal 10 and the ring gate electrode 9, and an equivalent effect is attained also in these cases. Also in these cases, it is preferable to render the resistivity of the ring-shaped resistor to be inserted 0.1 mΩ·cm or more.

(c) Further, an equivalent effect is attained also when coating at least one of the ring-shaped gate terminal 10, the ring gate electrode 9 and the gate electrode 4a with a resistor film. Also in these cases, it is preferable to render the resistivity of the resistor film 0.1 mΩ·cm or more.

(d) Further, an equivalent effect is attained also when arranging a resistor between the outer peripheral side end portion of the ring-shaped gate terminal 10 and the multilayer substrate 18. In this case, it is preferable to render the resistor to be inserted a ring-shaped one having resistivity of at least 0.1 mΩ·cm. Particularly the idea in this modification (d) is applicable not only to the GCT thyristor of FIG. 1 but also to a GTO thyristor having a lead-shaped gate terminal.

While an embodiment of the present invention has been disclosed and described in detail, the foregoing description illustrates an applicable aspect of the present invention, and the present invention is not restricted to this. That is, it is possible to consider numerous corrections and modifications for the described aspect within a range not departing from the scope of the present invention.

Industrial Applicability

The pressure-contact type semiconductor device according to the present invention is employed in various applied devices. In relation to a GCT thyristor which is one mode of the present invention, for example, this is utilizable as a high power element in a power applied device such as a reactive power generator (Static Var Generator), a Back to Back device, a frequency converter or the like. Further, it is also possible to apply the GCT thyristor to an industrial bulk inverter such as an iron and steel roller.

What is claimed is:

1. A pressure-contact type semiconductor device comprising:

a discoidal semiconductor substrate having a gate electrode region arranged on its outermost peripheral portion; and gate terminal means having one side coming into contact with said gate electrode region and another side elongated to an outer part for forming a path for a gate current while uniformly supplying said gate current to said gate electrode region;

wherein said gate terminal means functions as a resistance whose resistivity is at least 0.1 mΩ·cm.

2. The pressure-contact type semiconductor device according to claim 1, wherein
said gate terminal means comprises:
an annular gate electrode formed on a surface of said gate electrode region,
a ring gate electrode of an annular body coming into contact with said gate electrode,
a ring-shaped gate terminal of an annular plate having an inner peripheral side end portion coming into contact with said ring gate electrode, and
a multilayer substrate having one side coming into contact with an outer peripheral side end portion of said ring-shaped gate terminal and another side elongated up to said outer part.

3. The pressure-contact type semiconductor device according to claim 2, wherein
at least one of said ring-shaped gate terminal, said ring gate electrode and said gate electrode is a resistor having resistivity of at least 0.1 mΩ·cm.

4. The pressure-contact type semiconductor device according to claim 2, wherein
said gate terminal means further comprises:
a ring-shaped resistor arranged between said ring-shaped gate terminal and said ring gate electrode.

5. The pressure-contact type semiconductor device according to claim 2, wherein
said gate terminal means further comprises:
a ring-shaped resistor arranged between said gate electrode and said ring gate electrode.

6. The pressure-contact type semiconductor device according to claim 2, wherein
said gate terminal means further comprises:
a resistor arranged between said outer peripheral side end portion of said ring-shaped gate terminal and a part of said multilayer substrate coming into contact with said outer peripheral side end portion.

7. The pressure-contact type semiconductor device according to claim 2, wherein
at least one of said ring-shaped gate terminal, said ring gate electrode and said gate electrode is coated with a resistor film.

8. The pressure-contact type semiconductor device according to claim 1, wherein the gate terminal means comprises an alloy selected from a group consisting of Ni—Cr—Fe, Ni—Cr and Fe—Cr—Al.

9. A pressure-contact type semiconductor device comprising:
a discoidal semiconductor substrate having a gate electrode region arranged on its outermost peripheral portion; and
a gate terminal part having one side coming into contact with said gate electrode region and another side elongated to an outer part for forming a path for a gate current and arranged for uniformly supplying said gate current to said gate electrode region;
wherein said gate terminal part comprises:
a resistor whose resistivity is at least 0.1 mΩ·cm.

10. The pressure-contact type semiconductor device according to claim 9, wherein said gate terminal part comprises:
an annular gate electrode formed on a surface of said gate electrode region,
a ring gate electrode of an annular body coming into contact with said gate electrode,
a ring-shaped gate terminal of an annular plate having an inner peripheral side end portion coming into contact with said ring gate electrode, and
a multilayer substrate having one side coming into contact with an outer peripheral side end portion of said ring-shaped gate terminal and another side elongated up to said outer part, and
at least one of said ring-shaped gate terminal, said ring gate electrode and said gate electrode is said resistor.

11. The pressure-contact type semiconductor device according to claim 9, wherein said gate terminal part comprises:
an annular gate electrode formed on a surface of said gate electrode region,
a ring-shaped resistor coming into contact with said gate electrode,
a ring gate electrode of an annular body coming into contact with said resistor,
a ring-shaped gate terminal of an annular plate having an inner peripheral side end portion coming into contact with said ring gate electrode, and
a multilayer substrate having one side coming into contact into contact with an outer peripheral side end portion of said ring-shaped gate terminal and another side elongated up to said outer part.

12. The pressure-contact type semiconductor device according to claim 9, wherein said gate terminal part comprises:
an annular gate electrode formed on a surface of said gate electrode region,
a ring gate electrode of an annular body coming into contact with said gate electrode,
a ring-shaped resistor coming into contact with said ring gate electrode,
a ring-shaped gate terminal of an annular plate having an inner peripheral side end portion coming into contact with said resistor, and
a multilayer substrate having one side coming into contact with an outer peripheral side end portion of said ring-shaped gate terminal and another side elongated up to said outer part.

13. The pressure-contact type semiconductor device according to claim 9, wherein said gate terminal part comprises:
an annular gate electrode formed on a surface of said gate electrode region,
a ring gate electrode of an annular body coming into contact with said gate electrode,
a ring-shaped gate terminal of an annular plate having an inner peripheral side end portion coming into contact with said ring gate electrode,
a resistor coming into contact with an outer peripheral side end portion of said ring-shaped gate terminal, and
a multilayer substrate having one side coming into contact with said resistor and another side elongated up to said outer part.

14. The pressure-contact type semiconductor device according to claim 9, wherein said gate terminal part comprises:

an annular gate electrode formed on a surface of said gate electrode region, a ring gate electrode of an annular body coming into contact with said gate electrode, a ring-shaped gate terminal of an annular plate having an inner peripheral side end portion coming into contact with said ring gate electrode, and a multilayer substrate having one side coming into contact with an outer peripheral side end portion of said ring-shaped gate terminal and another side elongated up to said outer part, and at least one of said ring-shaped gate terminal, said ring gate electrode and said gate electrode is coated with a resistor film.

15. The pressure-contact type semiconductor device according to claim 9, wherein the gate terminal part includes a plurality of components, at least one of said components of the gate terminal part comprising an alloy selected from a group consisting of Ni—Cr—Fe, Ni—Cr and Fe—Cr—Al.

16. The pressure-contact type semiconductor device according to claim 9, wherein the resistor comprises an alloy selected from a group consisting of Ni—Cr—Fe, Ni—Cr and Fe—Cr—Al.

17. A pressure-contact type semiconductor device comprising:

a discoidal semiconductor substrate having an annular gate electrode formed on its surface;

a ring gate electrode of an annular body coming into contact with said gate electrode, and a ring-shaped gate terminal of an annular plate having an inner peripheral side end portion coming into contact with said ring gate electrode, wherein said ring-shaped gate terminal is a resistor having resistivity of at least 0.1 mΩ·cm.

* * * * *

UNITED STATES PATENT AND TRADEMARK OFFICE
CERTIFICATE OF CORRECTION

PATENT NO. : 6,423,988 B1
DATED : July 23, 2002
INVENTOR(S) : Sato

It is certified that error appears in the above-identified patent and that said Letters Patent is hereby corrected as shown below:

<u>Title page,</u>
Item [54], should read:
-- [54] PRESSURE-CONTACT TYPE SEMICONDUCTOR DEVICE --

Signed and Sealed this

Twenty-fifth Day of February, 2003

JAMES E. ROGAN
*Director of the United States Patent and Trademark Office*